US011562786B2

(12) United States Patent
Nien et al.

(10) Patent No.: US 11,562,786 B2
(45) Date of Patent: Jan. 24, 2023

(54) MEMORY DEVICE HAVING A NEGATIVE VOLTAGE CIRCUIT (71) Applicant: Taiwan Semiconductor Manufacturing Company, Ltd., Hsinchu (TW)

(72) Inventors: Yi-Hsin Nien, Hsinchu (TW); Hidehiro Fujiwara, Hsinchu (TW); Chih-Yu Lin, Taichung (TW); Yen-Huei Chen, Jhudong Township, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/082,404

(22) Filed: Oct. 28, 2020

(65) Prior Publication Data

US 2021/0201990 A1 Jul. 1, 2021

Related U.S. Application Data (60) Provisional application No. 62/955,178, filed on Dec. 30, 2019.

(51) Int. Cl.
*G11C 11/419* (2006.01)
(52) U.S. Cl.
CPC .................................. *G11C 11/419* (2013.01)
(58) Field of Classification Search
CPC ..................................................... G11C 11/419
USPC ......................................................... 365/154
See application file for complete search history.

(56) References Cited

U.S. PATENT DOCUMENTS

| 8,120,975 | B2* | 2/2012 | Kenkare | G11C 11/419 |
| | | | | 365/189.11 |
| 9,324,392 | B1* | 4/2016 | Asenov | G11C 7/12 |
| 9,721,650 | B1* | 8/2017 | Raj | G11C 11/419 |
| 9,812,191 | B1 | 11/2017 | Chander et al. | |
| 9,865,337 | B1 | 1/2018 | Ahmed et al. | |
| 10,381,054 | B1* | 8/2019 | Sreenivasula Reddy | |
| | | | | G11C 7/12 |
| 10,692,568 | B2 | 6/2020 | Yang et al. | |
| 10,734,066 | B2 | 8/2020 | Fujiwara et al. | |
| 2012/0075936 | A1 | 3/2012 | Fujimura | |
| 2014/0119148 | A1* | 5/2014 | Earle | G11C 8/16 |
| | | | | 365/230.02 |
| 2018/0151220 | A1* | 5/2018 | Singh | G11C 7/12 |
| 2019/0244658 | A1* | 8/2019 | Dhani Reddy | G11C 11/419 |
| 2020/0090736 | A1* | 3/2020 | Schaefer | G11C 5/145 |

FOREIGN PATENT DOCUMENTS

| TW | I506625 B | 11/2015 |
| TW | 201629956 A | 8/2016 |
| TW | 201814709 A | 4/2018 |

(Continued)

*Primary Examiner* — Sung Il Cho
(74) *Attorney, Agent, or Firm* — Merchant & Gould P.C.

(57) ABSTRACT

A memory device is provided. The memory device includes a memory cell and a bit line connected to the memory cell. A negative voltage generator is connected to the bit line. The negative voltage generator, when enabled, is operative to provide a first write path for the bit line. A control circuit is connected to the negative voltage generator and the bit line. The control circuit is operative to provide a second write path for the bit line when the negative voltage generator is not enabled.

20 Claims, 7 Drawing Sheets (56) References Cited

FOREIGN PATENT DOCUMENTS

TW 201916016 A 4/2019
TW I656532 B 4/2019

* cited by examiner

MEMORY DEVICE HAVING A NEGATIVE VOLTAGE CIRCUIT

PRIORITY CLAIM AND CROSS-REFERENCE

This application claims priority to U.S. Provisional Patent Application No. 62/955,178 titled "MEMORY DEVICE" filed Dec. 30, 2019, the disclosure of which is hereby incorporated by reference in its entirety.

BACKGROUND

A common type of integrated circuit memory is a static random access memory (SRAM) device. A typical SRAM memory device includes an array of bit cells, with each bit cell having six transistors connected between an upper reference potential and a lower reference potential. Each bit cell has two storage nodes where information may be stored. The first node stores the desired information, while the complementary information is stored at the second storage node. SRAM cells have the advantageous feature of holding data without requiring a refresh.

The negative bit line technique, however comes with a price. For example, an increased number of transistors results in drop in a gate to source voltage (referred to as Vgs) of write driver transistors or multiplexer transistors. The drop in the Vgs results in smaller write current which may limit the Vccmin scaring.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The lowest VDD voltage (positive power supply voltage) at which an SRAM bit cell may function is referred to as a Vccmin voltage or simply as the Vccmin. Having a low VDD, which is nearer to the Vccmin, reduces leakage current and also reduces the incidence of read flips in the SRAM. While, a high VDD improves the probability of successful write operations. Therefore, the Vccmin is constrained by the write operation. Various approaches have been explored to lower Vccmin, which is the minimum power supply voltage VCC required for reliable read and write operations, and to suit the ever-decreasing power supply voltages. For example, a negative bit-line (NBL) technique is used to improve cell write-ability. The negative bit-line techniques drive a voltage level of a bit line to a negative voltage. This negative voltage provides a boost for the write operation performed to bit cells coupled to the bit lines (BL/BLB).

The disclosure provides a write assist circuit with a pull down control circuit (simply referred to as a control circuit in this disclosure) in a memory device. The control circuit is provided for a write operation in a memory device with a negative voltage generator. The control circuit provides a separate write path for a selected bit line of the memory device when the negative voltage generator circuit is not enabled during a write operation. As described in greater detail in the following parts of the disclosure, the separate write path includes two stacking transistors compared to three transistors of the negative voltage generator. The separate path, therefore, decreases a voltage degradation for a multiplexer transistor and improves the Vccmin for the write operation when the negative voltage generator is not enabled for the write operation.

Figure 1:
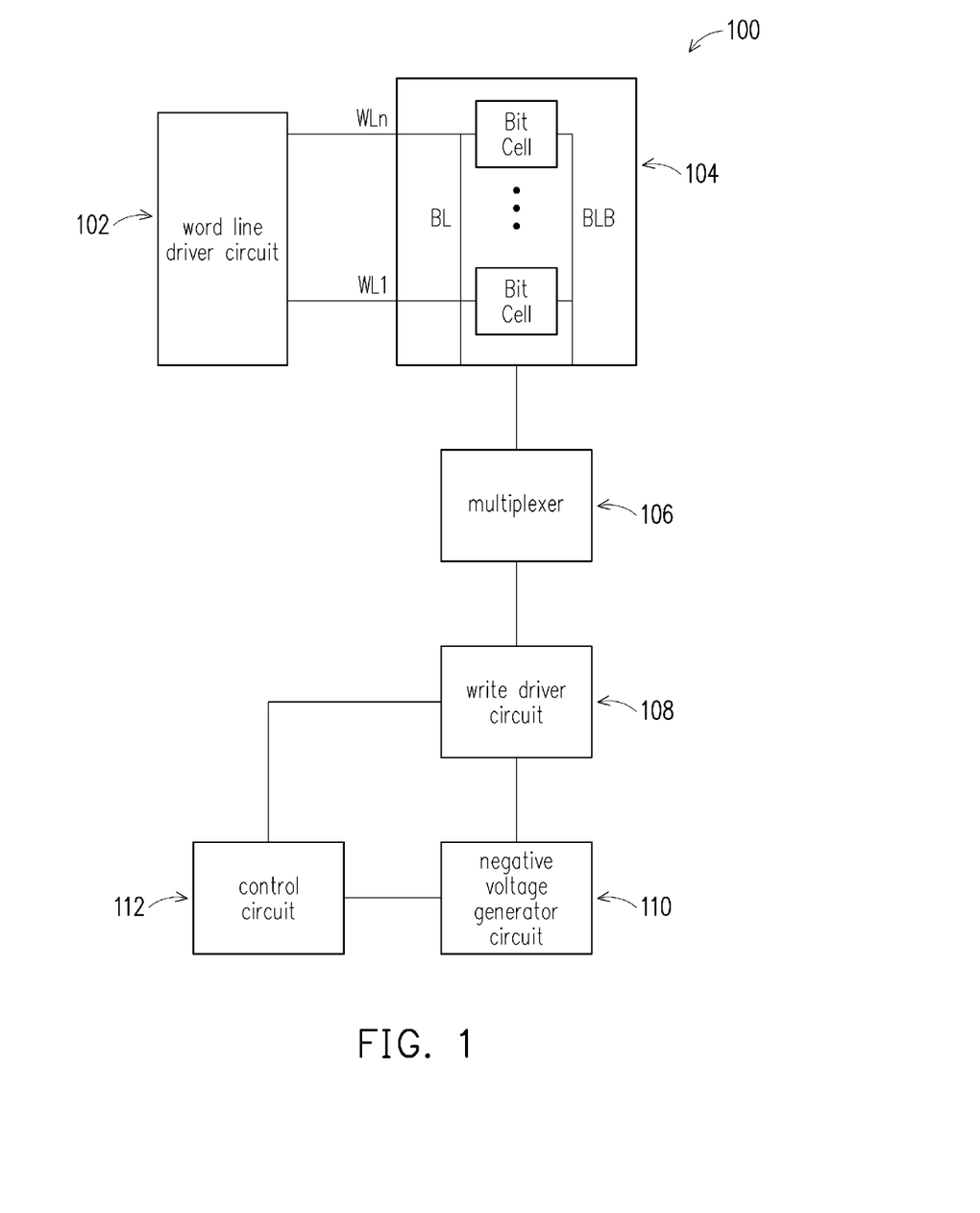
FIG. 1 is a block diagram illustrating an example memory device in accordance with some embodiments.

FIG. 1 is a block diagram of an example memory device 100 in accordance with some embodiments. Memory device 100 can be a random access memory, such as a static random access memory (SRAM) device. As shown in FIG. 1, memory device 100 includes a word line driver circuit 102, at least one cell array 104, a multiplexer 106, a write driver circuit 108, a negative voltage generator circuit 110, and a control circuit 112. It will be apparent to a person with ordinary skill in the art after reading this disclosure that memory device 100 may further include other components not shown in FIG. 1 and is not limited to components listed herein. In example embodiments, memory device 100 can be part of an integrated circuit (IC) chip.

Cell array 104 of memory device 100 includes a plurality of bit cells (for example, a first bit cell 114a, . . . , a nth bit cell 114n). The plurality of bit cells (also sometimes referred to as memory cells) are arranged in a matrix of a plurality of rows and a plurality of columns. Each of the plurality of rows include a first plurality of bit cells of the plurality of bit cells and each of the plurality of columns include a second plurality of bit cells of the plurality of bit cells. Each of the first plurality of bit cells of each of the plurality of rows are connected to one of a plurality of word lines (for example, one of a first word line WL1, . . . , a nth word line WLn) and each of the second plurality of bit cells of each of the plurality of columns are connected to a pair of bit lines (that is, a bit line and a complementary bit line (BL/BLB)). Each bit cell of cell array 104 is configured as a pair of cross-coupled invertors that operate to reinforce the data state stored therein, i.e., the true data node reinforces the complementary data node and vice versa. Each bit cell of cell array 104 is configured to store one bit of information (that is, a bit value of 0 or a bit value of 1).

Word line driver circuit 102 is connected to cell array 104. For read and write operations in cell array 104, word line driver circuit 102 is operative to select one of the plurality of word lines (that is, WL) and charge the selected word line to a predetermined voltage. Multiplexer 106 is also connected to cell array 104. For read and write operations in cell array 104, multiplexer 106 is operative to select one of the plurality of bit line pairs (that is BL/BLB).

Write driver circuit 108 is connected to multiplexer 106. Write driver circuit 108 is operative to write one bit of information to one or more bit cells connected to the selected one of the plurality of word lines and the selected bit line pair of the plurality of bit line pairs. In example embodiments, write driver circuit 108 is connected to cell array 104 via multiplexer 106. More specifically, write driver circuit 106 is connected to the bit line pairs (BL/BLB) of cell array 104 via multiplexer 106.

Negative voltage generator circuit 110 is connected to write driver circuit 108. Negative voltage generator circuit 110 is operative to assist in a write operation in cell array 104. For example, negative voltage generator circuit 110, when enabled, is operative to lower the Vccmin during the write operation. In example embodiments, negative voltage generator circuit 110 is enabled in response to a write assist signal. For example, negative voltage generator circuit 110 is enabled when the write assist signal changes from a first value to a second value (that is, from a logic high to a logic low or from a logic low to a logic high). As explained in the following sections of the disclosure, when enabled, negative voltage generator circuit 110, provides a first write path having a lower Vccmin for the write operation. In example embodiments, negative voltage generator circuit 110 is coupled to the pair of bit lines (BL/BLB) of cell array 104 through write driver circuit 108 and multiplexer 106.

Control circuit 112 is also connected to negative voltage generator circuit 110 and write driver circuit 108. Control circuit 112 is operative to assist in a write operation in cell array 104. For example, control circuit 112 is operative to provide a second write path for the write operation when negative voltage generator circuit 110 is not enabled. The second write path is also provided or enabled in response to the write assist signal. For example, the second write path is enabled when the write assist signal changes from the second value to the first value (that is, from a logic low to a logic high or from a logic high to a logic low). Thus, and in accordance with example embodiment, the second write path is enabled when negative voltage generator circuit 110 is not enabled for a write operation. Control circuit 112 is coupled to the pair of bit lines (BL/BLB) of cell array 104 through write driver circuit 106 and multiplexer 108.

Figure 2:
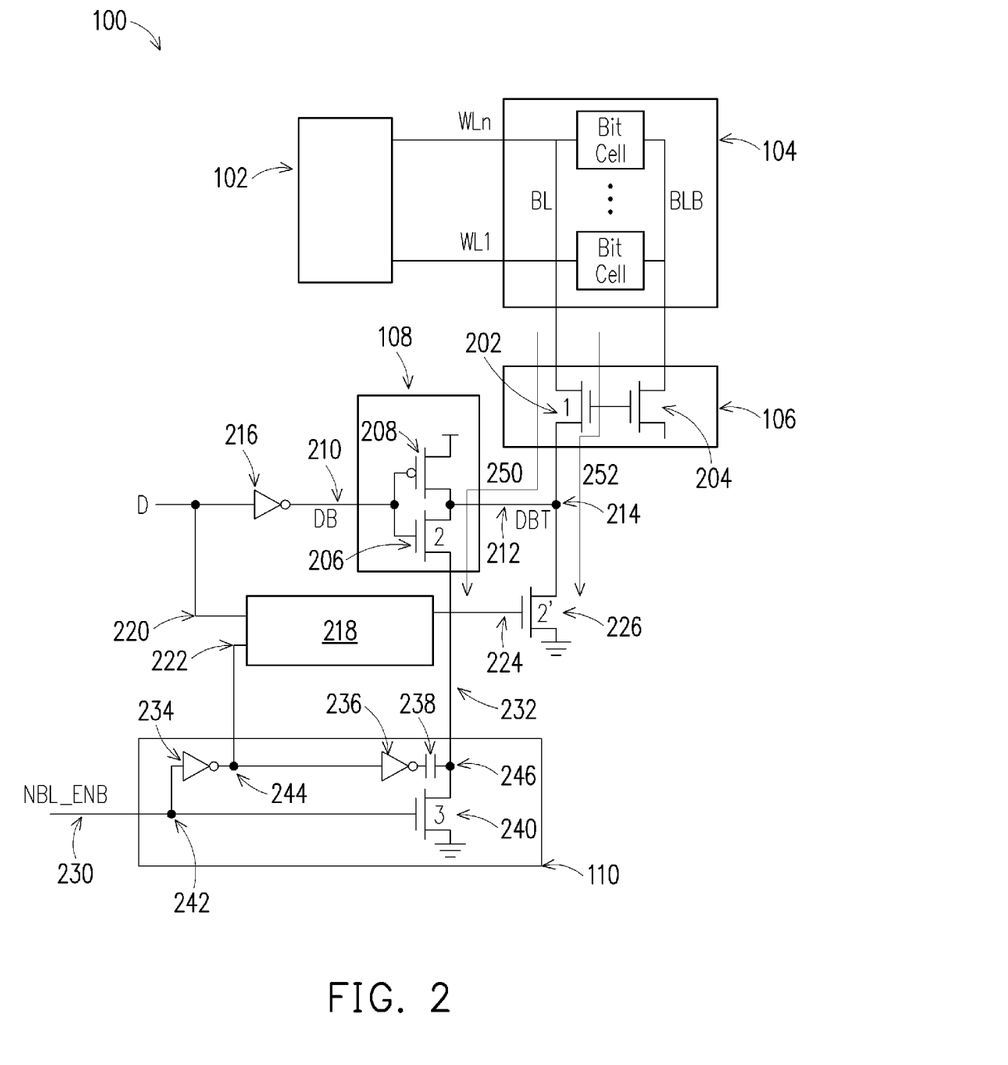
FIG. 2 is a partial circuit diagram and a partial block diagram of a memory device in accordance with some embodiments.

FIG. 2 is a partial circuit diagram and a partial block diagram of memory device 100 in accordance with some embodiments. Memory device 100 of FIG. 2 includes word line driver circuit 102, cell array 104, multiplexer 106, write driver circuit 108, negative voltage generator circuit 110, and control circuit 112. Multiplexer 106 may be a column multiplexer and may include a multiplexer first transistor 202 and a multiplexer second transistor 204. Multiplexer first transistor 202 is connected to a bit line BL of the selected bit line pair and multiplexer second transistor 204 is connected to a complimentary bit line (also referred to as a bit line bar BLB) of the selected bit line pair. For example, a source of multiplexer first transistor 202 is connected to the bit line BL and a source of multiplexer second transistor 204 is connected to the bit line bar BLB. In addition, a drain of multiplexer first transistor 202 is connected to a first node 214. Moreover, a gate of multiplexer first transistor 202 is connected to a gate of multiplexer second transistor 204.

In example embodiments, multiplexer first transistor 202 and multiplexer second transistor 204 are symmetrical. That is, a source of each of multiplexer first transistor 202 and multiplexer second transistor 204 can be selected to be a drain and a drain can be selected to be a source. Moreover, although, each of multiplexer first transistor 202 and multiplexer second transistor 204 are shown to be n-channel metal oxide semiconductor (nMOS) transistors, other types of transistors are within the scope of the disclosure. For example, each of multiplexer first transistor 202 and multiplexer second transistor 204 may also include a metal oxide semiconductor field effect transistor (MOSFET), a p-channel metal oxide semiconductor (pMOS) transistor, and a complementary metal oxide semiconductor (CMOS) transistor.

Write driver circuit 108 of memory device 100 includes a write driver input terminal 210 and a write driver output terminal 212. Write driver input terminal 210 is connected to a data signal and write driver output terminal 212 is connected to first node 214. Write driver input terminal 210 is connected to the data signal (represented as D) via a first logic circuit 216. First logic circuit 216 is operative to provide an inverted data signal (represented as DB) at write driver input terminal 210. In example embodiments, first logic circuit 216 is a NOT logic circuit, for example, a NOT gate. However, other types of logic gates are within the scope of the disclosure.

In addition, write driver circuit 108 includes a write driver first transistor 206 and a write driver second transistor 208. Write driver first transistor 206 is an nMOS transistor and write driver second transistor 208 is a pMOS transistor. However, other types of transistors are within the scope of the disclosure. For example, each of write driver first transistor 206 and write driver second transistor 208 may include a MOSFET, an nMOS transistor, a pMOS transistor, and a CMOS transistor. In example embodiments, write driver first transistor 206 and write driver second transistor 208 are symmetrical. That is, a source of each of write driver first transistor 206 and write driver second transistor 208 can be selected to be a drain and a drain can be selected to be a source.

As shown in FIG. 2, write driver first transistor 206 and write driver second transistor 208 of write driver circuit 108 are arranged to form an invertor circuit between write driver input terminal 210 and write driver output terminal 212. For example, a gate of write driver first transistor 206 is connected to a gate of write driver second transistor 208 which in turn is connected to write driver input terminal 210. A source of write driver second transistor 208 is connected to a supply voltage (that is, Vdd) and a drain of write driver first transistor 206 is connected to negative voltage generator circuit 110. Moreover, a source of write driver first transistor 206 is connected to a drain of write driver second transistor 208 which in turn is connected to write driver output terminal 212.

In example embodiments, write driver circuit 108 transposes the data signal. For example, write driver circuit 108 receives a data signal (represented as D) at write driver input terminal 210 and provides a transposed data signal (represented as DT) at write driver output terminal 212. In other embodiments, such as that shown in FIG. 2, write driver circuit 108 receives an inverse of a data signal (represented as DB) at write driver input terminal 210 and provides a transposed inverted data signal (represented as DBT) at write driver output terminal 212. For example, write driver input terminal 210 is operative to receive the data signal and write driver output terminal 212 is operative to provide the transposed data signal. The transposed data signal is provided to the bit line BL via multiplexer first transistor 202 via first node 214.

Although, write driver circuit 108 is shown to include only one invertor circuit, it will be apparent to person with ordinary skill in the art after reading this disclosure that write driver circuit 108 can include multiple invertor circuits. For example, write driver circuit 108 may include another invertor circuit which may be connected to the bit line bar BLB via second multiplexer second transistor 204. In addition, the invertor circuit of write driver circuit 108 is shown to include only two transistors (that is, write driver first transistor 206 and write driver second transistor 208) it will be apparent to person with ordinary skill in the art after reading this disclosure that write driver circuit 108 can include a different number of transistors.

Negative voltage generator circuit 110 of memory device 100 includes a negative voltage generator input terminal 230 and a negative generator output terminal 232. Negative voltage generator input terminal 230 is operative to receive a write assist signal (represented as NBL_ENB). In some examples, the write assist signal is also referred to as a write enable signal. Negative voltage generator output terminal 232 is operative to provide a negative voltage (also referred to as a negative VSS or NVSS) which is applied to first node 214 to lower the Vccmin for a write operation. For example, the negative voltage is provided at negative voltage generator output terminal 232 which is connected to write driver circuit 108 which in turn is connected to the bit line BL via first node 214.

In addition, negative voltage generator circuit 110 includes a negative voltage generator first logic circuit 234, a negative voltage generator second logic circuit 236, a negative voltage generator capacitor 238, and a negative voltage generator transistor 240. An input of negative voltage generator first logic circuit 234 is connected to a negative voltage generator first node 242 which is connected to negative voltage generator input terminal 230. An output of negative voltage generator first logic circuit 234 is connected to a negative voltage generator second node 244. Thus, negative voltage generator first logic circuit 234 provides an inverse of the write assist signal at negative voltage generator second node 244.

An input of negative voltage generator second logic circuit 236 is connected to negative voltage generator second node 244. Negative voltage generator second logic circuit 236 is operative to provide an inverse of an inverted write assist signal as an output. Therefore, negative voltage generator first logic circuit 234 and negative voltage generator second logic circuit 236 in combination form a delay circuit. The output of negative voltage generator second logic circuit 236 is connected to a first terminal of negative voltage generator capacitor 238. A second terminal of negative voltage generator capacitor 238 is connected to a negative voltage generator third node 246. Negative voltage generator third node 246 is connected to negative voltage generator output terminal 232.

A source of negative voltage generator transistor 240 is connected to negative voltage generator third node 246. A drain of negative voltage generator transistor 240 is connected to ground. A gate of negative voltage generator transistor 240 is connected to negative voltage generator first node 242. In example embodiments, negative voltage generator transistor 240 is symmetrical, thus, the source can be selected to be the drain while the drain can be selected to be the source. Moreover, although negative voltage generator transistor 240 is shown to be an nMOS transistor, other types of transistors are within the scope of the disclosure. For example, negative voltage generator transistor 240 may be a MOSFET, a pMOS transistor, and a CMOS transistor. In addition, each of negative voltage generator first logic circuit 234 and negative voltage generator second logic circuit 236 can be an invertor circuit, such as, a NOT logic gate. However, other types of invertor circuits are within the scope of the disclosure.

Continuing with FIG. 2, memory device 100 further includes a control block 218 and a pull down transistor 226. Control block 218 and pull down transistor 226 may together form control circuit 112 of memory device 100. Control block 218 includes a control block first input terminal 220, a control block second input terminal 222, and a control block output terminal 224. Control block first input terminal 220 is connected to the data signal and control block second input terminal 222 is connected to the write assist signal. Control block output terminal 224 is connected to a gate of pull down transistor 226. A source of pull down transistor 226 is connected to first node 214 and a drain of pull down transistor 226 is connected to ground. In example embodiments, pull down transistor 226 is symmetrical. That is, a source of pull down transistor 226 can be selected to be a drain and a drain can be selected to be a source. Moreover, although, pull down transistor 226 is shown to be a nMOS transistor, other types of transistors are within the scope of the disclosure. For example, pull down transistor 226 may be a MOSFET, a pMOS transistor, and a CMOS transistor.

In example embodiments, and as shown in FIG. 2, multiplexer first transistor 202, write driver first transistor 206, and negative voltage generator transistor 240 form a first write path 250 for the write operations. Hence, first write path 250 includes negative voltage generator 110 which provides a negative voltage to the bit line BL which assists in writing the data to the bit cells. Moreover, multiplexer first transistor 202 and pull down transistor 226 form a second write path 252 for the write operations. Hence, second write path 252 includes a fewer number of transistors (that is, two) than first write path 250 which includes three transistors. In example embodiments, second write path 252 is enabled when negative voltage generator circuit 110 is not enabled. Moreover, second write path 252 is not enabled when negative voltage generator circuit 110 is enabled.

In example embodiments, the bit line BL is selectively connected to first write path 250 or second write path 252 for a write operation. For example, a write operation in memory device 100 is triggered by the write enable signal. That is, the write operation is triggered when the write enable changes from a first logic value to a second logic value (for example, from a logic low to a logic high, or vice versa). The write assist signal can be generated from the write enable signal. For example, in some examples, the write assist signal may be linked with the write enable signal and be responsive to the write enable signal. A write assist signal generator circuit (not shown) may be provided to generate the write assist signal. For example, when the write enable signal changes to a logic high indicating initiation of the write operation, the write assist signal may also change to a logic high enabling negative voltage generator circuit 110. In addition, when the write enable signal changes to a logic low indicating an end of the write operation, the write assist signal may change to a logic low disabling negative voltage generator circuit 110.

During a write operation, when the write assist signal is at a logic high, the gate of negative voltage generator transistor 240 is also at a logic high, which switches negative voltage generator transistor 240 ON which results in charging of negative voltage generator capacitor 238. In addition, when the write assist signal is at a logic high, negative voltage generator third node 246 is connected to ground through negative voltage generator transistor 240. In this configuration, negative voltage generator circuit 110 is labeled as not enabled or disabled.

When the write assist signal changes to a logic low, the gate of negative voltage generator transistor 240 is also at a logic low, which switches negative voltage generator transistor 240 OFF. This causes a discharge from negative voltage generator capacitor 238, which drives a voltage of negative voltage generator third node 246 from ground to a negative value. This negative voltage is provided to the bit line BL, which provides a boost for the write operation performed to bit cells coupled to the bit line BL. In this configuration, negative voltage generator circuit 110 is labeled as enabled.

In addition, during the write operation, when the write assist signal is at a logic low, control block 218 is operative to provide an output of a logic value low. Therefore, when the write assist signal is at a logic low during a write operation, control block output terminal 224 is also at a logic low. This switches OFF pull down transistor 226. Hence, in accordance with example embodiments, pull down transistor 226 is switched OFF when negative voltage generator circuit 110 is enabled. By extension, and in accordance with example embodiments, second write path 252 is disabled when negative voltage generator circuit 110 is enabled.

However, during the write operation, when the write assist signal is at a logic high, control block 218 is operative to provide an output of a logic value high. Therefore, control block output terminal 224 is also at a logic high when the data signal is at a logic low. This switches ON pull down transistor 226, which in turn enables second write path 252. Hence, in accordance with example embodiments, pull down transistor 226 is switched ON when negative voltage generator circuit 110 is disabled and the data signal is at a logic low. By extension, and in accordance with example embodiments, second write path 252 is enabled when negative voltage generator circuit 110 is disabled and the data signal is at a logic low. Therefore, the proposed technique provides a separate path, that is, second path 252, for the bit line BL during a write operation when negative voltage generator circuit 110 is not enabled.

Figure 3A:
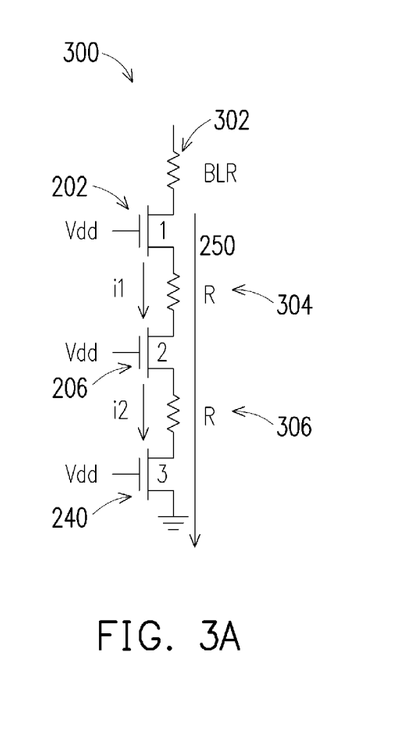
FIG. 3A illustrates a circuit diagram for a first write path of a memory device in accordance with some embodiments.

FIG. 3A illustrates a circuit diagram 300 for first write path 250 of memory device 100 in accordance with some embodiments. The first write path 250, when negative voltage generator circuit 110 is enabled, provides a negative voltage at first node 214 which optimizes the write Vccmin performance. As shown in FIG. 3A, circuit diagram 300 for first write path 250 includes a bit line resistor BLR 302, multiplexer first transistor 202, a first resistor R 304, write driver first transistor 206, a second resistor R 306, and negative voltage generator transistor 240. Bit line resistor BLR 302 is representative of a resistance value of the bit line BL. First resistor R 304 is a representative of a resistance value of connectors between multiplexer 106 and write driver circuit 108. Second resistor R 306 is a representative of a resistance value of connectors between and write driver circuit 108 and negative voltage generator circuit 110.

Continuing with circuit diagram 300 of FIG. 3A, a first current i1 is a representative of a current which flows through first resistor 304 between multiplexer 106 and write driver circuit 108 during a write operation. Moreover, a second current i2 is a representative of a current which flows through first resistor 304 between multiplexer 106 and write driver circuit 108 during the write operation. Hence, a voltage difference between a gate and a source of multiplexer first transistor 202 (represented as Vgs1) is provided as:

$$Vgs1 = Vdd - Vds2 - Vds3 - (i1+i2)*R$$

where Vdd is a supply voltage, Vds2 is a voltage difference between the drain and the source of write driver first transistor 206, and Vds3 is a voltage difference between the drain and the source of negative voltage generator transistor 240.

Moreover, a voltage difference between the gate and the source of write driver first transistor 206 (represented as Vgs2) is provided as:

$$Vgs2 = Vdd - Vds3 - (i2)*R$$

In addition, a voltage difference between the gate and the source of negative voltage generator transistor 240 (represented as Vgs3) is approximately equal to the supply voltage. That is:

$$Vgs3 = Vdd.$$

Therefore, and as shown in circuit diagram 300, the bit line BL, in absence of control circuit 112, could be connected to first write path 250 which includes three transistors (that is, multiplexer first transistor 202, write driver first transistor 206, and negative voltage generator transistor 240) during a write operation when negative voltage generator circuit 110 is not enabled.

Figure 3B:
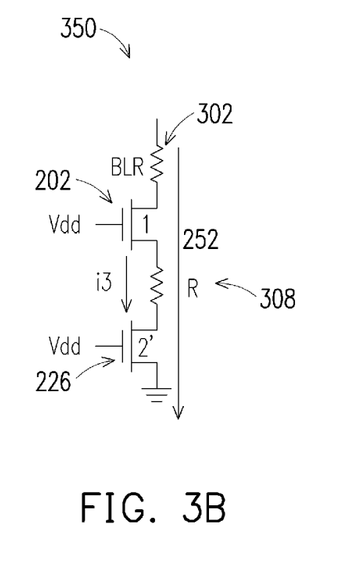
FIG. 3B illustrates a circuit diagram for a second write path of a memory device in accordance with some embodiments.

FIG. 3B illustrates a circuit diagram 350 for second write path 252 of memory device 100 in accordance with some embodiments. Second write path 252 optimizes the write Vccmin performance while minimizing the impact on transistor reliability during the write operations. As shown in FIG. 3B, circuit diagram 300 for second write path 252 includes bit line resistor BLR 302, multiplexer first transistor 202, a third resistor R 308, and pull down transistor 226. Bit line resistor BLR 302 is representative of a resistance value of the bit line BL. Third resistor R 308 is a representative of a resistance value of connectors between multiplexer 106 and pull down transistor 226.

A third current i3 in circuit diagram 300 is a representative of a current which flows through third resistor R 308 between multiplexer 106 and pull down transistor 226 during a write operation. In example embodiments, the third current i3 is approximately equal to the first current i1. Hence, a voltage difference between the gate and source of multiplexer first transistor 202 (represented as Vgs1) is provided as:

$$Vgs1=Vdd-Vds2'-(i1)*R$$

where Vds2' is a voltage difference between the drain and the source of pull down transistor 226. In addition, a voltage difference between the gate and the source of pull down transistor 226 (represented as Vgs2') is approximately equal to the supply voltage. That is:

$$Vgs2'=Vdd.$$

Figure 4:
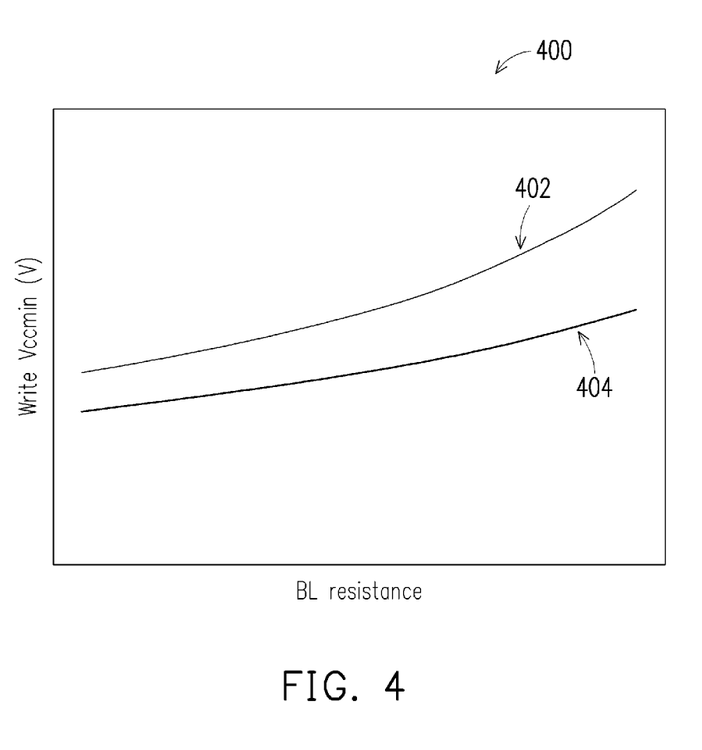
FIG. 4 is a graph illustrating a Vccmin voltage for the first write path and the second write path in accordance with some embodiments.

FIG. 4 is a graph 400 illustrating a comparison of a Vccmin for first write path 250 and second write path 252 of memory device 100 in accordance with some example embodiments. For example, graph 400 includes a first plot 402 illustrating the Vccmin for first write path 250 and a second plot 404 illustrating the Vccmin for second write path 252 for different values of bit line resistor BLR 302. As shown in graph 400, for a given bit line resistor BLR 302 value, the Vccmin is lower for second write path 252 compared to first write path 250. In addition, and as illustrated in graph 400 a gap between the Vccmin for first data path 250 and second data path 252 increases with an increase in bit line resistor BLR 302 value. Therefore, second data path 252 may improve the write performance when negative voltage generator circuit 110 is not enabled for the write operation. For example, as shown in graph 400, with the techniques disclosed herein, the Vccmin is improved in the same bit line resistance. In addition, with second data path 252, a sensitivity of Vccmin to the BL resistance is also reduced.

Figure 5:
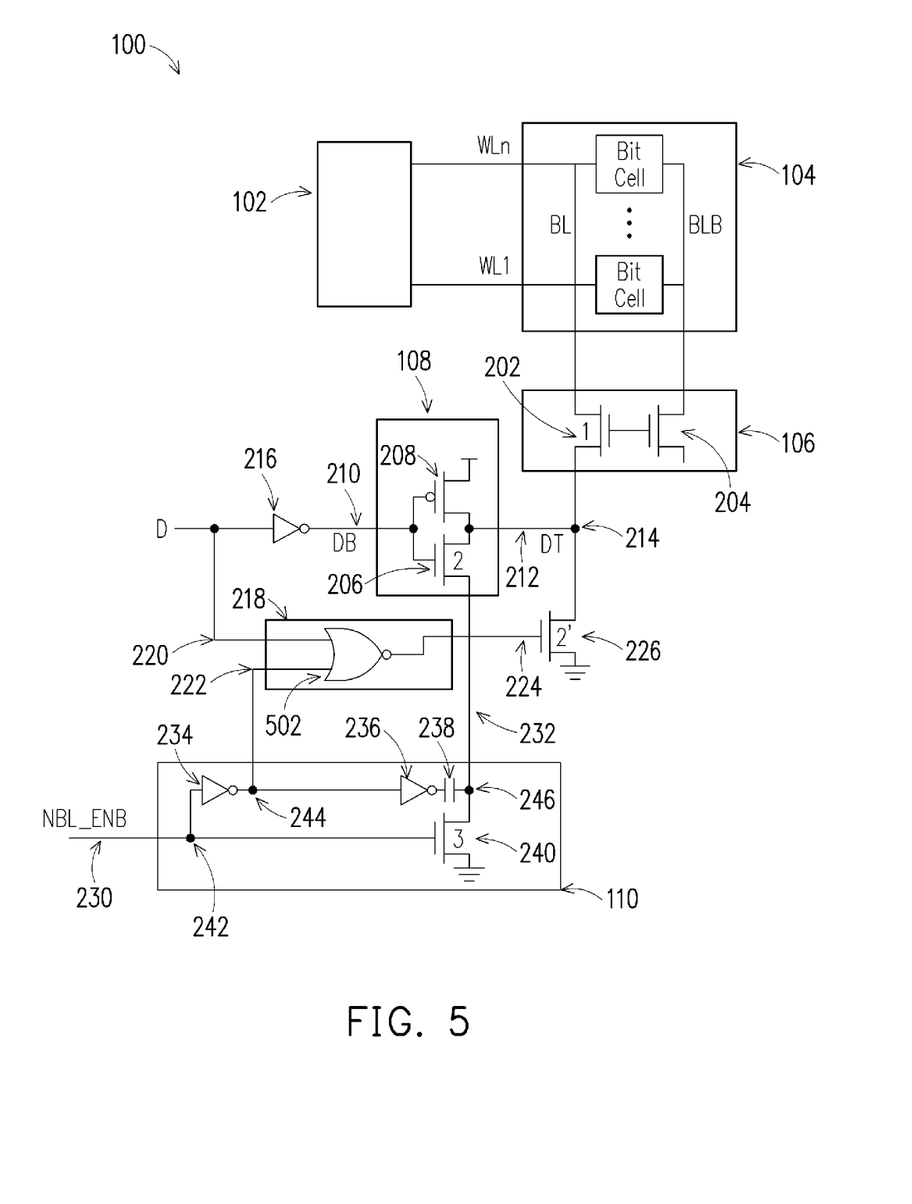
FIG. 5 is another partial circuit diagram and a partial block diagram of a memory device in accordance with some embodiments.

FIG. 5 is another partial circuit diagram and a partial block diagram of memory device 100 in accordance with some embodiments. As shown in FIG. 5, memory device 100 includes write driver circuit 102, cell array 104, multiplexer 106, write driver circuit 108, negative voltage generator circuit 110, and control circuit 112. In addition, memory device 100 of FIG. 5 further includes control block 218 and pull down transistor 226. Control block 218 of memory device 100 of FIG. 5 includes a NOR logic circuit 502. A first input terminal of NOR logic circuit 502 is connected to the data signal and a second input terminal of NOR logic circuit 502 is connected to the inverted write assist signal. In addition, an output terminal of NOR logic circuit 502 is connected to the gate of pull down transistor 226.

In accordance with example embodiments, an output of NOR logic circuit 502 is a logic high when the data signal is at a logic low and the write assist signal is at a logic high. Therefore, an output terminal of NOR logic circuit 502 is at a logic high when the data signal is at a logic low and the write assist signal is at a logic high. This switches ON pull down transistor 226 which in turn enables second write path 252. That is, second write path 252 is enabled when the output terminal of NOR logic circuit 502 is at a logic high. Although control block 218 of FIG. 5 is shown to include NOR logic circuit 502, it will be apparent to a person with skill in the art after reading this disclosure that control block 218 may include other types of logic circuits. For example, FIG. 6 illustrates an example of a memory device having control block 218 which includes a AND logic circuit.

Figure 6:
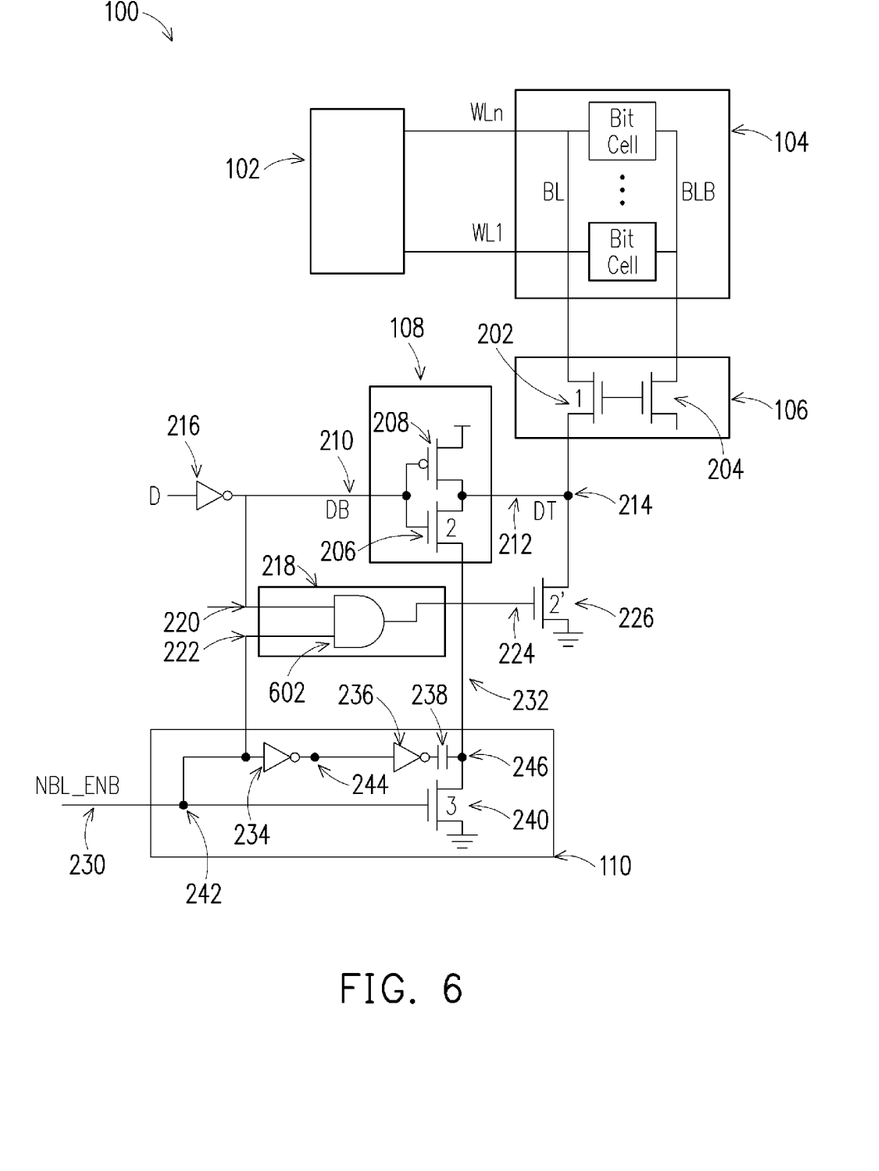
FIG. 6 is yet another partial circuit diagram and a partial block diagram of a memory device in accordance with some embodiments.

FIG. 6 is yet another partial circuit diagram and a partial block diagram of memory device 100 in accordance with some embodiments. As shown in FIG. 6, memory device 100 includes write driver circuit 102, cell array 104, multiplexer 106, write driver circuit 108, negative voltage generator circuit 110, and control circuit 112. In addition, memory device 100 of FIG. 6 further includes control block 218 and pull down transistor 226. Control block 218 of memory device 100 of FIG. 6 includes a AND logic circuit 602. A first input terminal of AND logic circuit 602 is connected to the inverted data signal and a second input terminal of AND logic circuit 602 is connected to the write enable signal. In addition, an output terminal of AND logic circuit 602 is connected to the gate of pull down transistor 226.

In example embodiments, an output of AND logic circuit 602 is a logic high when the data signal is at a logic low and the write assist signal is at a logic high. Therefore, output terminal of AND logic circuit 602 is at logic high when data signal is at a logic low and the write assist signal is at a logic high. This switches ON pull down transistor 226. That is, second write path 252 is enabled when the output terminal of AND logic circuit 602 is at a logic high.

Figure 7:
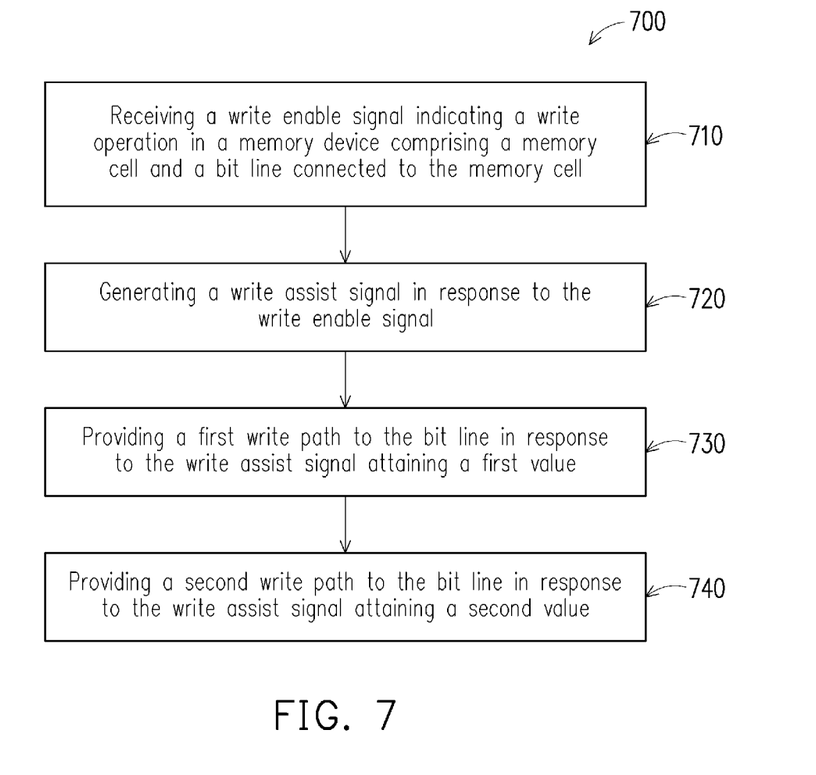
FIG. 7 is a flow diagram illustrating a method for operating a memory device in accordance with some embodiments.

FIG. 7 is a flow diagram illustrating a method 700 for operating a memory device, in accordance with some embodiments. For example, FIG. 7 is a flow diagram illustrating a method 700 for operating memory device 100 as described above with reference to FIGS. 1-6. Method 700 may be performed by a processor. In addition, method 700 may be stored as instructions on a memory device, which when executed by a processor can cause the processor to perform method 700.

At block 710 of method 700, a write enable signal is received. The write enable signal indicates a write operation in a memory device comprising a memory cell and a bit line connected to the memory cell. For example, a write enable signal is received indicating a write operation in memory device 100.

At block 720 of method 700, a write assist signal is generated in response to the write enable signal. For example, a write assist signal, that is NBL_ENB, is generated in response to the write enable signal. The write assist signal may be generated by a write assist signal generator associated with memory device 100. The write assist signal can be linked to the write enable signal.

At block 730 of method 700, a first write path is provided to the bit line. The first write path is provided in response to the write assist signal attaining a first value. For example, when the write assist signal, that is, the NBL_ENB, is at a logic low, first write path 250 is provided to the bit line BL of memory device 100. In addition, when the write assist signal is at a logic low, negative voltage generator circuit 110 is enabled to provide a negative voltage to the bit line BL.

At block 740 of method 700, a second write path is provided to the bit line. The second write path is provided in response to the write assist signal attaining a second value. For example, when the write assist signal, that is, NBL_ENB, is a logic high, second write path 252 is provided to the bit line BL of memory device 100. In addition, when the write assist signal is at a logic high, negative voltage generator circuit 110 is not enabled. However, when the write assist signal, that is, the _ENB, is at a logic high, pull down transistor 226 is enabled to provide second write path 252.

In accordance with example embodiments, therefore, the disclosure provides a write assistance scheme with a pull-down control circuit (that is, control circuit 112). Control circuit 112 is operative to separate a write path between an ON state and OFF state of negative voltage generator circuit 110. For example, the OFF state, control circuit 112 provides second write path 252 which includes two stacking transistors compared to three stacking transistors of first write path 250. The second write path further improves the Vccmin. Thus, with the techniques disclosed herein, the Vccmin is improved for the same bit line resistance. In addition, a sensitivity of the Vccmin to the BL resistance is also reduced.

In accordance with example embodiments, a memory device comprises: a memory cell; a bit line connected to the memory cell; a negative voltage generator connected to the bit line, wherein the negative voltage generator, when enabled, is operative to provide a first write path for the bit line; and a control circuit coupled to the negative voltage generator and the bit line, wherein the control circuit is operative to provide a second write path for the bit line when the negative voltage generator is not enabled.

In example embodiments, a memory device comprises: a memory cell; a bit line connected to the memory cell; a first write path connected to the bit line, wherein the first write path comprises a negative voltage generator circuit operative to provide a negative voltage to the bit line; and a second write path connectable to the bit line, wherein the bit line is connected to the second write path in response to a write assist signal changing from a first value a second value.

In accordance with example embodiments a method for operating a memory device comprises: receiving a write enable signal indicating a write operation in a memory device comprising a memory cell and a bit line connected to the memory cell; generating a write assist signal in response to the write enable signal; enabling a negative voltage generator in response to the write assist signal attaining a first value, the negative voltage generator providing a first write path to the bit line; and providing a second write path to the bit line in response to the write assist signal attaining a second value.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
    a memory cell;
    a bit line connected to the memory cell;
    a negative voltage generator connected to the bit line, wherein the negative voltage generator is operative to provide a first write path for the bit line; and
    a control circuit connected to the negative voltage generator and the bit line, wherein the control circuit comprises a pull down circuit and a pull down transistor, wherein the pull down circuit comprises a first input terminal, a second input terminal, and an output terminal, wherein the first input terminal of the pull down circuit is operative to receive data signal to be written to the memory cell, wherein the second input terminal of the pull down circuit is directly connected to the negative voltage generator and is operative to receive a write assist enable signal that is being provided to the negative voltage generator, wherein the output terminal of the pull down circuit is connected to a gate of the pull down transistor, wherein the pull down circuit is operative to enable the pull down transistor in response to the write assist enable signal attaining a second value, and wherein the pull down transistor is operative to provide a second write path for the bit line when the negative voltage generator is not enabled.

2. The memory device of claim 1, wherein the negative voltage generator is enabled in response to the write assist enable signal attaining a first value.

3. The memory device of claim 1, wherein the pull down circuit comprises a NOR logic gate.

4. The memory device of claim 1, wherein the pull down circuit comprises a AND logic gate.

5. The memory device of claim 1, further comprising a write driver circuit connected to the bit line and a multiplexer connected to the bit line.

6. The memory device of claim 1, wherein the negative voltage generator, when enabled, is operative to provide a negative voltage to the bit line.

7. The memory device of claim 1, wherein the second write path comprises a lower resistance value than the first write path.

8. A memory device, comprising:
    a memory cell;
    a bit line connected to the memory cell;
    a first write path connected to the bit line, wherein the first write path comprises a negative voltage generator circuit, wherein the negative voltage generator circuit, when enabled, is operative to provide a negative voltage to the bit line;
    a second write path connectable to the bit line; and
    a control circuit connected to the negative voltage generator and the bit line, wherein the control circuit comprises a pull down circuit and a pull down transistor, wherein the pull down circuit comprises a first input terminal, a second input terminal, and an output terminal, wherein the first input terminal of the pull down circuit is operative to receive data signal to be written to the memory cell, wherein the second input terminal of the pull down circuit is directly connected to the negative voltage generator and is operative to receive a write assist enable signal that is being provided to the negative voltage generator, wherein the output terminal of the pull down circuit is connected to a gate of the pull down transistor, wherein the pull down circuit is operative to enable the pull down transistor in response to the write assist enable signal attaining a second value, wherein when enabled the pull down transistor provides the second path, and wherein the bit line is connected to the second write path in response to the write assist enable signal changing from a first value the second value.

9. The memory device of claim 8, wherein the negative voltage generator circuit is operative to provide the negative voltage to the bit line in response to the write assist enable signal attaining the first value.

10. The memory device of claim 8, wherein the control circuit comprises a AND logic gate.

11. The memory device of claim 8, wherein the control circuit comprises a NOR logic gate.

12. The memory device of claim 8, wherein the first write path further comprises a multiplexer circuit transistor and a write driver circuit transistor.

13. The memory device of claim 8, wherein the second write path further comprises a multiplexer circuit transistor and the pull down transistor.

14. The memory device of claim 8, wherein the second write path comprises a lower resistance value than the first write path.

15. A method for operating a memory device, the method comprising:
   receiving a write enable signal indicating a write operation in a memory device comprising a memory cell and a bit line connected to the memory cell;
   generating a write assist enable signal in response to the write enable signal;
   enabling a negative voltage generator in response to the write assist signal attaining a first value, the negative voltage generator providing a first write path to the bit line; and
   enabling, by a control circuit, a second write path to the bit line in response to the write assist signal attaining a second value, wherein the control circuit is connected to the negative voltage generator and the bit line, wherein the control circuit comprises a pull down circuit and a pull down transistor, wherein the pull down circuit comprises a first input terminal, a second input terminal, and an output terminal, wherein the first input terminal of the pull down circuit is operative to receive data signal, wherein the second input terminal of the pull down circuit is directly connected to the negative voltage generator and is operative to receive the write assist enable signal that is being provided to the negative voltage generator, wherein the output terminal of the pull down circuit is connected to a gate of the pull down transistor, and wherein the pull down circuit is operative to enable the pull down transistor in response to the absence of the write assist enable signal attaining the second value.

16. The method of claim 15, wherein providing the first write path to the bit line in response to the write assist enable signal attaining the first value comprising providing a negative voltage to the bit line in response to the write assist signal attaining the first value.

17. The method of claim 15, wherein the pull down circuit comprises an AND logic circuit.

18. The method of claim 15, wherein the pull down circuit comprises a NOR logic circuit.

19. The method of claim 15, wherein the first write path further comprises a multiplexer circuit transistor and a write driver circuit transistor.

20. The method of claim 15, wherein the second write path further comprises a multiplexer circuit transistor and the pull down transistor.

* * * * *